United States Patent [19]

Shigemi et al.

[11] Patent Number: 4,900,238
[45] Date of Patent: Feb. 13, 1990

[54] SCROLL TYPE COMPRESSOR WITH RELEASABLY SECURED HERMETIC HOUSING

[75] Inventors: Shimizu Shigemi, Sakai; Kikuchi Kazuto, Honjo; Terauchi Kiyoshi, Isesaki, all of Japan

[73] Assignee: Sanden Corporation, Gunma, Japan

[21] Appl. No.: 169,983

[22] Filed: Mar. 18, 1988

[30] Foreign Application Priority Data

Mar. 20, 1987 [JP] Japan ................................ 62-67354
Mar. 20, 1987 [JP] Japan ................................ 62-67335

[51] Int. Cl.$^4$ .......................... F04B 35/04; F04C 18/04
[52] U.S. Cl. ..................................... 417/410; 417/902;
418/149; 418/55; 29/402.03; 29/888.022
[58] Field of Search .......................... 418/55, 149, 270;
417/902, 410; 29/156.4 R, 402.03–402.08

[56] References Cited

U.S. PATENT DOCUMENTS

| | | | |
|---|---|---|---|
| Re. 19,961 | 5/1936 | Crane | 417/902 |
| 801,182 | 10/1905 | Creux | 418/55 |
| 1,156,700 | 10/1915 | May . | |
| 1,934,155 | 11/1933 | Van Deventer | 417/902 |
| 2,178,425 | 10/1939 | Johnson | 417/902 |
| 3,463,091 | 8/1969 | Delsuc . | |
| 4,065,279 | 12/1977 | McCullough | 418/55 |
| 4,201,521 | 5/1980 | Carlson | 417/53 |
| 4,439,118 | 3/1984 | Iimori | 418/55 |
| 4,466,784 | 8/1984 | Hiraga | 418/55 |
| 4,560,330 | 12/1985 | Murayama et al. | 418/55 R |

FOREIGN PATENT DOCUMENTS

| | | | |
|---|---|---|---|
| 59925 | 9/1982 | European Pat. Off. | 418/55 |
| 58-172485 | 10/1983 | Japan | 418/55 |
| 61-116089 | 6/1986 | Japan | 418/55 |
| 61-291793 | 12/1986 | Japan . | |

*Primary Examiner*—John J. Vrablik
*Attorney, Agent, or Firm*—Banner, Birch, McKie & Beckett

[57] ABSTRACT

An hermetic type scroll compressor is disclosed which includes first and second cup shaped casings and a center block therebetween. The first cup shaped casing is provided with a fixed scroll affixed within the first cup shaped casing, orbiting scroll interfitted at an angular and radial offset with the fixed scroll, rotation preventing device disposed between the orbiting scroll and the center block. The second cup shaped casing is provided with a drive mechanism. The first cup shaped casing and the second cup shaped casing are releasably and hermetically secured through the center block thereby enabling disassembly, reassembly and indepedent inspection of the hermetic type scroll compressor components.

31 Claims, 2 Drawing Sheets

SCROLL TYPE COMPRESSOR WITH RELEASABLY SECURED HERMETIC HOUSING

BACKGROUND OF THE INVENTION

This invention relates to a scroll type compressor and more particularly, to a motor driven scroll compressor having the compression and drive mechanisms within a hermetically sealed container.

Scroll type fluid displacement apparatus are well known in the prior art. For example, U.S. Pat. No. 801,182 issued to Creux discloses such an apparatus which includes two scrolls, each having a circular end plate and a spiroidal or involute spiral element. The scrolls are maintained angularly and radially offset so that both spiral elements interfit to form a plurality of line contacts between their spiral curved surfaces to thereby seal off and define at least one pair of fluid pockets. The relative orbital motion of the two scrolls shifts the line contacts along the spiral curved surfaces and, as a result, the volume of the fluid pockets increases or decreases, dependent on the direction of the orbital motion. Thus, a scroll type fluid displacement apparatus may be used to compress, expand or pump fluids.

Furthermore, U.S. Pat. No. 4,560,330 for example, discloses such a hermetic type scroll compressor which includes a fixed scroll, orbiting scroll, rotation preventing device and driving mechanism in one sealed container.

In this hermetic type scroll compressor, the essentially inseparable container is sealed by welding or other means so that leakage of refrigerant gas from the container is completely prevented.

While the above mentioned hermetic type scroll compressor prevents leakage of refrigerant gas from the container, this hermetic type scroll compressor can hardly be disassembled and reassembled for inspection, and repair or exchange of parts.

SUMMARY OF THE INVENTION

It is a primary object of this invention to improve hermetic scroll compressor container to facilitate disssembling and reassembling of a hermetic type scroll compressor by releasably and hermetically securing a first casing and a second casing through the center block to form the hermetically sealed container.

It is another object of this invention to improve hermetic type scroll compressor manufacturing and maintenance efficiencies by assembling a first housing and a second housing of a hermetic type scroll compressor separately so that the first housing, second housing and components therein can be disassembled, reassembled and inspected independently.

It is yet a further object of this invention to provide a releasably hermetic securing mechanism which also provides alignment means for aligning appropriate components within the first casing with appropriate components within the second casing.

A hermetic type scroll compressor, according to one embodiment of this invention, includes first and second cup shaped casings and a center block therebetween. A fixed scroll is fixedly disposed in the first cup shaped casing and has a circular end plate from which a first wrap extends. An orbiting scroll has a circular end plate from which a second wrap extends. The first and second wraps interfit at an angular and radial offset to form a plurality of line contacts to define at least one pair of sealed off fluid pockets. A rotation preventing device is disposed between the orbiting scroll and the center block which is connected to the first and second cup shaped casings. A driving mechanism having a motor driven drive shaft is disposed in the second cup shaped casing and operatively connects to the orbiting scroll to effect the orbital motion of the orbiting scroll by rotation of a drive shaft while rotation of the orbiting scroll is prevented by a rotation preventing device. As a result, the fluid pockets shift along the spiral curved surfaces of the wraps which change the volume of the fluid pockets.

According to the present invention, the first housing having the first cup shaped casing, fixed scroll, orbiting scroll and rotation preventing device is built on the center block. The second housing having the drive shaft, motor and second cup shaped casing is also built on the center block. The first cup shaped casing and the second cup shaped casing are releasably and hermetically secured to each other through the center block.

Further objects, features and other aspects of this invention will be understood from the detailed description of the preferred embodiment of this invention with reference to the annexed drawings.

DETAILED DESCRIPTION OF THE PREFERRED EMBODIMENT

Figure 1:
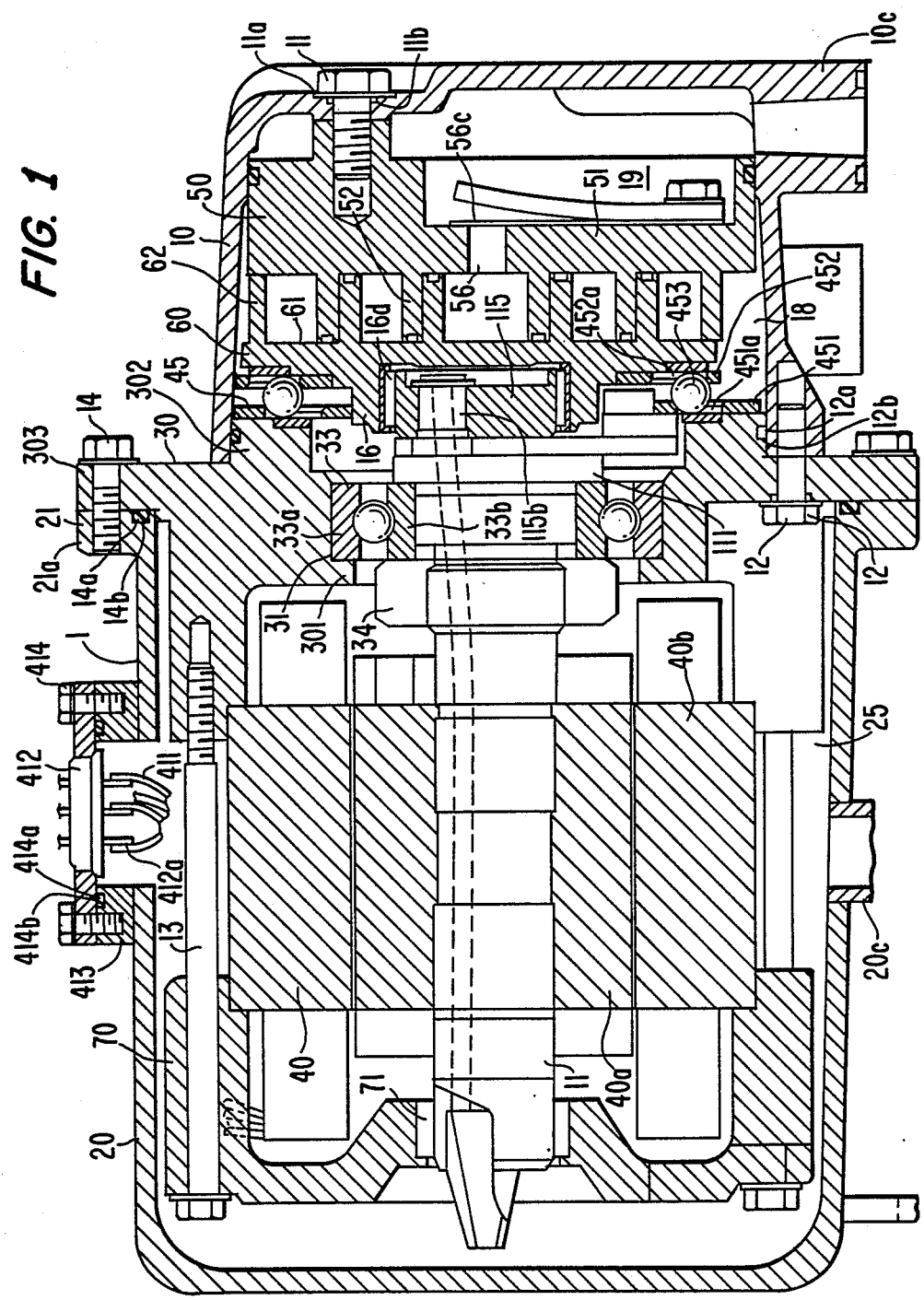
FIG. 1 is a vertical longitudinal sectional view of a hermetic type scroll compressor in accordance with one embodiment of this invention.

FIG. 1 depicts a hermetic type scroll refrigerant compressor 1 in accordance with a first embodiment of the present invention. Compressor 1 includes first cup shaped casing or shell 10, second cup shaped casing or shell 20 and center block 30 which is attached to first cup shaped casing 10 and second cup shaped casing 20. Opening or bore 31 is formed in the center of center block 30 for receiving drive shaft 11. Radial projection 301 is formed in the inner peripheral surface of opening 31. Drive shaft 11 is rotatably supported in opening 31 by bearing 33. Bearing 33 firmly fits in opening 31. Outer ring 33a of bearing 33 is stopped at a rear end surface of radial projection 301. Nut 34 is screwed on drive shaft 11 and faces one end surface of inner ring 33b of bearing 33. Flange 111 located at one end of drive shaft 11 faces the other end surface of inner ring 33b of bearing 33. Axial motion of drive shaft 11 is thereby prevented by flange 111 and nut 34. Rotor 40a of motor 40 surrounds drive shaft 11. Rotor 40a may be firmly inserted over drive shaft 11.

Fixed scroll 50 includes circular end plate 51 and wrap or spiral elements 52 affixed to or extending from one end surface of end plate 51. Fixed scroll 50 is fixed within the inner chamber of first cup shaped casing 10 by screws 11 screwed into end plate 51 from outside of first cup shaped casing 10. Seal ring 11b is located between an inner surface of screw flange 11a and the outer end surface of first cup shaped casing 10 to seal the connection therebetween. Circular end plate 51 of fixed scroll 50 partitions the inner chamber of first cup shaped casing 10 into two chambers, such as front chamber 18 and rear chamber 19.

Orbiting scroll 60 is disposed at the rear end side of center block 30 through later mentioned rotation preventing/thrust bearing device 45. Orbiting scroll 60 includes circular end plate 61 and wrap or spiral element 62 affixed to or extending from one end surface of circular end plate 61. Annular projection 16 is formed opposite the surface of circular end plate 61 from which spiral element 62 extends. Bearing 16d is disposed within the inner peripheral wall of the annular projection 16.

Bushing 115 is attached to one end of drive shaft 11 at a radial offset through pin member 115b. Bushing 115 is inserted into annular projection 16 of orbiting scroll 60. Orbiting scroll 60 is rotatably supported by bushing 115 through bearing 16d placed on the outer peripheral surface of bushing 115.

Rotation preventing/thrust bearing device 45 is placed between the rear end surface of center block 30 and the end surface of circular end plate 61. Rotation preventing/thrust bearing device 45 includes fixed ring 451 attached on the axial end surface of annular projection 302 which is formed in the rear end surface of center block 30, orbiting ring 452 attached on the end surface of circular end plate 61, and a plurality of bearing elements, such as balls 453, placed between pockets 451a, 452a formed by rings 451, 452. The rotation of orbiting scroll 60 during orbital motion is prevented by the interaction of balls 453 with rings 451, 452. Also, the axial thrust load from orbiting scroll 60 is supported on center block 30 through balls 453. While orbiting scroll 60 orbits, the rotation of orbiting scroll 60 is prevented by rotation preventing/thrust bearing device 45.

In this situation, spiral element 62 of orbiting scroll 60 interfits spiral element 52 of fixed scroll 50 at an angular offset of 180° and at a predetermined radial offset. Spiral elements 62 and 52 define at least one pair of sealed off fluid pockets between their interfitting surfaces.

Radial projection 303 formed in the outer peripheral surface of center block 30 is fixed to the axial end surface of first cup shaped casing 10 by screws 12. Seal ring 12a is disposed within circumferential groove 12b of annular projection 302 to form a seal between the inner wall of first cup shaped casing 10 and the outer peripheral surface of annular projection 302.

The other end of drive shaft 11 is also rotatably supported by supporting block (rear bearing unit) 70 through bearing 71. Stator 40b of motor 40 is held firmly between center block 30 and rear bearing unit 70. Rear bearing unit 70 is fixed to center block 30 by screws 13 screwed into center block 30 from the rear end of rear bearing unit 70. Therefore, stator 40b is held firmly between center block 30 and rear bearing unit 70. The inner peripheral surface of stator 40b and the outer peripheral surface of rotor 40a face each other.

Rear bearing unit 70 and motor 40 are covered by second cup shaped casing 20. Flange 21a formed at opening end 21 of second cup shaped casing 20 is fixed to radial projection 303 of center block 30 by screws 14. Seal ring 14a is disposed within a circular groove 14b of flange 21a to form a seal between the front end surface of radial projection 303 and an axial end surface of flange 21a.

Wires 411 from stator 40b are connected with terminals 412a. Terminals 412a are connected to an external electrical source (not shown) through a switch (also not shown). Hermetic seal base 412 is insulated from terminals 412a and fixed to projection 413 which is formed on side surface of second cup shaped casing 20 by screws 414. Seal ring 414a is disposed within a circular groove 414b of projection 413 to form a seal between the rear end surface of hermetic seal base 412 and the axial end surface of projection 413.

By turning on the motor 40, a magnetic field of stator 40b is generated so that rotor 40a begins rotation, thereby rotating drive shaft 11. This rotation is transferred to orbiting scroll 60 through bushing 115. Orbiting scroll 60 begins orbital motion due to rotation prevention/thrust bearing device 45. Refrigerant gas is introduced to inner chamber 25 of second cup shaped casing 21 through inlet port 20c which is formed at the side wall of second cup shaped casing 20, and flows through front chamber 18 of first cup shaped casing 10 through bearing 33 and then through rotation preventing/thrust bearing device 45. The refrigerant gas in the front chamber is taken into the sealed fluid pockets between the fixed scroll and orbiting scroll, then moves toward the center of the spiral wraps during the orbital motion of the orbiting scroll with a resultant volume reduction and compression, and is discharged to rear chamber 19 as through hole 56 and one-way valve 56c. Discharged gas in the rear chamber then flows to an external fluid circuit (not shown) through outlet port 10c.

Figure 2:
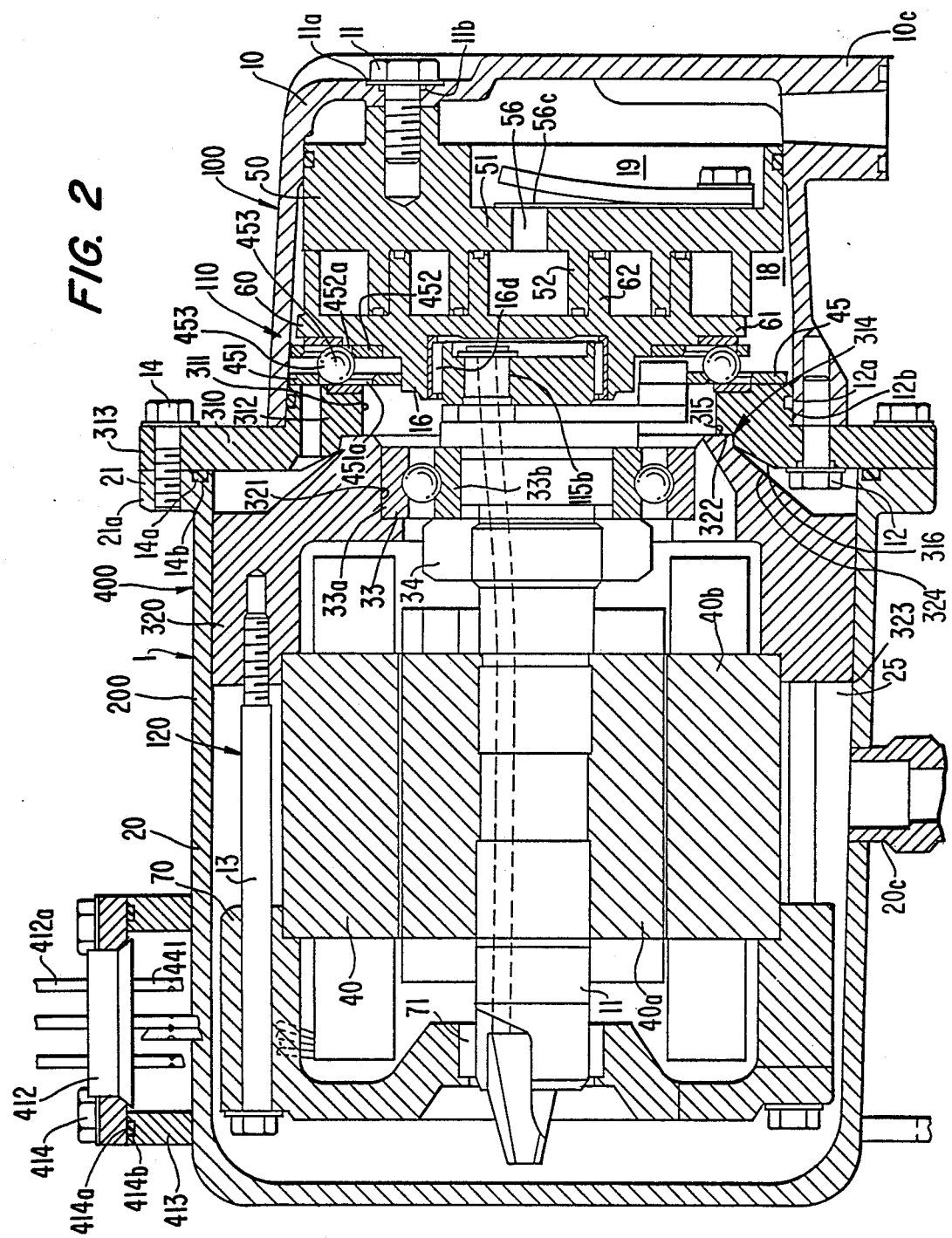
FIG. 2 is a vertical longitudinal sectional view of a hermetic type scroll compressor in accordance with another embodiment of this invention.

Referring to FIG. 2, hermetic type scroll refrigerant compressor 1 is shown in accordance with another embodiment of the present invention. The same construction is accorded like numerals as that shown in FIG. 1. The description of that constructions is substantially omitted to simplify the description herein.

Orbiting scroll 60 interfits fixed scroll 50. Annular projection 16 is formed opposite the surface of circular end plate 61 from which spiral element 62 is extended. Bearing 16d is disposed within the inner peripheral wall of the annular projection 16. A first center block 310 having central opening or bore 311 is disposed adjacent to rotation preventing/thrust bearing device 45. The first center block 310 is releasably and hermetically secured to an axial end surface of first cup shaped casing 10 by screws 12. Seal ring 12a is disposed within a circumferential groove 12b of annular projection 312 formed at the rear end surface of the center block 310 to form a seal between the inner wall of the first cup shaped casing 10 and the outer peripheral surface of annular projection 312. A first housing 100 includes the first center block 310 and the first cup shaped casing 10 having fixed scroll 50, orbiting scroll 60 and rotation preventing/thrust bearing device 45 therein. Compression mechanism section 110 comprises a first center block 310 and the construction to the right thereof as shown in FIG. 2.

Second center block 320 rotatably supports drive shaft 11 in center block central opening or bore 321 through bearing 33. One end of drive shaft 11 is rotatably supported by rear bearing unit 70 through bearing 71. Stator 40b of motor 40 is held between the second center block 320 and rear bearing unit 70. Rear bearing unit 70 is releasably secured to the second center block 320 by screws 13. Thus, driving mechanism section 120 is to the left of first center block 310 as shown in FIG. 2.

The second center block 320 is positioned firmly within second cup shaped casing 20 and against ridge 323 formed in the inner wall of the second cup shaped casing 20. A second housing 200 includes the driving mechanism section 120 and the second cup shaped casing 20. Bushing 115 is attached to one end of drive shaft 11 at a radial offset through pin member 115b.

The first housing 100 and the second housing 200 are fitted together so that bushing 115 is inserted into annular projection 16 of circular end plate 61. Drive shaft 11 is attached to orbiting scroll 60 at a radial offset. Flange 21a formed at opening end 21 of second cup shaped casing 20 is releasably and hermetically secured to radial projection 313 of first center block 310 by screws 14 and seal ring 14a. Seal ring 14a is disposed within a circular groove 14b of flange 21a to form a seal between the front end surface of radial projection 313 and the axial end surface of flange 21a. Annular projection 322 and the recess defined by annular projection or portion 312 form an alignment mechanism for aligning drive shaft 11 with the orbiting scroll when first housing 100 and second housing 200 engage first center block 310.

More specifically, compression mechanism section 110 and driving mechanism 120 are fitted together, the facing surfaces of first center block 310 and second center block 320 form an alignment mechanism for aligning drive shaft 11 with orbiting scroll 60.

Annular projection or portion 312 of first center block 310 includes annular recess 314 formed in an inner wall thereof. With reference to FIG. 2, recess 314 is formed at the front or left end of the inner wall which forms bore 311. Recess 314 includes abutment surface 315 which is substantially normal to the center line of shaft 11 when sections 110 and 120 are joined. Front end surface or guide surface 316 of first center block 310 extends radially outwardly from annular recess 314 for slidingly guiding second center block 320 therealong and toward annular recess 314. As can be seen while viewing FIG. 2, surface 316 is preferably frustoconical.

Annular projection 322 of second center block 320 has an outer diameter slightly smaller than the diameter of annular recess 314, so that projection 322 may securely interfit with recess 314 when the first and second center blocks are brought into engagement. As can be seen in FIG. 2, abutment surface 315 prevents annular projection 322, which is formed at the front or right end of second block 320, from penetrating within first cup shaped casing 10 beyond first center block 310. The front surface of second block 320 includes portion 324 which extends radially outwardly from annular projection 322. Portion 324 is shown as being frustoconical and as having a surface with a slope less than the slope of surface 316 with respect to the center line of shaft 11. The difference in slope provides a space between surfaces 316 and 324 and prevents excessive interference therebetween when joining sections 110 and 120. Accordingly, when sections 110 and 120 are being joined to form hermetically sealed compressor housing 400, front end surface 316 may guide or center annular projection 322 into annular recess 314. As a result, the facing surfaces of the first and second center blocks including projection 322 and annular recess 314 form an alignment mechanism for aligning drive shaft 11 with orbiting scroll 60.

Although illustrative embodiments of the invention have been described in detail with respect to the accompanying drawings, it is to be understood that the invention is not limited to those precise embodiments, and that various changes and modifications may be effected therein by one skilled in the art without departing from the scope of the invention.

We claim:

1. In a scroll type compressor with a hermetically sealed housing, the compressor comprising a fixed scroll fixedly disposed within said housing and having an end plate from which a first wrap extends into the interior of said housing, an orbiting scroll having an end plate from which a second wrap extends, said first and second wraps interfitting at an angular and radial offset to form a plurality of line contacts which define at least one pair of sealed off fluid pockets, a driving mechanism including a motor supported in said housing, said driving mechanism being operatively connected to said orbiting scroll to effect the orbital motion of said orbiting scroll, rotation preventing means for preventing the rotation of said orbiting scroll during orbital motion whereby the volume of the fluid pockets changes during orbital motion to compress the fluid in the pockets, the improvement comprising:

said housing including a first shell, a separate second shell and a center block, said center block being formed as a single piece element having a peripheral portion extending around the periphery of the compressor and an interior portion for rotatably supporting a portion of said drive mechanism, said peripheral portion including fastening means for releasably and hermetically securing said first shell to a first side of said peripheral portion of said center block and said second shell to a second side of said peripheral portion of said center block, at least a portion of said fastening means securing one of said first and second shells to said center block element being disposed within the other of said first and second shells.

2. The hermetically sealed scroll type compressor of claim 1 wherein said scrolls are surrounded by said first shell and said motor including a rotor and stator is surrounded by the second shell.

3. The hermetically sealed scroll type compressor of claim 2 further comprising said fixed scroll being releasably and hermetically sealed to the first shell.

4. The hermetically sealed scroll type compressor of claims 1, 2 or 3 wherein each shell is cup shaped.

5. The hermetically sealed scroll type compressor of claim 1 wherein at least a portion of said fastening means securing said first shell to said center block is disposed within said second shell.

6. In a scroll type compressor with a hermetically sealed housing, the compressor comprising a fixed scroll fixedly disposed within said housing and having an end plate from which a first wrap extends into the interior of said housing, an orbiting scroll having an end plate from which a second wrap extends, said first and second wraps interfitting at an angular and radial offset to form a plurality of line contacts which define at least one pair of sealed off fluid pockets, a driving mechanism including a motor supported in said housing, said driving mechanism being operatively connected to said orbiting scroll to effect the orbital motion of said orbiting scroll, rotation preventing means for preventing the rotation of said orbiting scroll during orbital motion whereby the volume of the fluid pockets changes during orbital motion to compress the fluid in the pockets, the improvement comprising:

said housing including a first shell, a separate second shell and a center block, said center block having a peripheral portion extending around the periphery of the compressor and an interior portion located inwardly of the peripheral portion, said first shell being releasably and hermetically secured to a first side of said peripheral portion of said center block, said second shell being releasably and hermetically secured to a second side of said peripheral portion of said center block, a portion of said rotation preventing means being connected to a first side of said interior portion of said center block, one end portion of said drive shaft being rotatably supported in a second opposite side of said interior portion of said center block, a rear bearing support block releasably connected to said second side of said interior portion of said center block, the other end portion of said drive shaft being supported by said rear bearing support block.

7. The hermetically sealed scroll type compressor of claim 6 wherein said center block is formed as a single piece element.

8. The hermetically sealed scroll type compressor of claim 6 wherein said center block is formed of a first block and a second separate block, said first block including said peripheral portion and said first side of said interior portion of said center block, and said second block including said second side of said interior portion of said center block.

9. The hermetically sealed scroll type compressor of claim 8 wherein said second block includes an annular projection, said first block includes an annular portion having an annular recess in the wall thereof, said recess having an abutment surface substantially normal to the drive shaft center line, the annular projection and recess cooperating to form an alignment means for aligning said drive shaft with the orbiting scroll.

10. The hermetically sealed scroll type compressor of claim 9 wherein the first block and second block each have a surface which extends radially outwardly from said first block annular portion and said second block annular projection respectively, and each surface is frustoconical.

11. The hermetically sealed scroll type compressor of claims 6, 7, 8 or 9 wherein said scrolls are surrounded by said first shell and said motor including a rotor and a stator are surrounded by said second shell.

12. The hermetically sealed scroll type compressor of claim 11 wherein said fixed scroll is releasably and hermetically secured to said first shell.

13. The hermetically sealed scroll type compressor according to claims 6, 7, 8 or 9 wherein the improvement further comprises each shell being cup shaped.

14. The hermetically sealed scroll type compressor of claim 9 wherein said annular projection and annular portion are concentrically disposed about said drive shaft.

15. The hermetically sealed scroll type compressor of claim 10 wherein said annular projection and and annular portion are concentrically disposed about said drive shaft.

16. In a scroll type compressor with a hermetically sealed housing, the compressor comprising a fixed scroll fixedly disposed within said housing and having an end plate from which a first wrap extends into the interior of said housing, an orbiting scroll having an end plate from which a second wrap extends, said first and second wraps interfitting at an angular and radial offset to form a plurality of line contacts which define at least one pair of sealed off fluid pockets, a driving mechanism including a motor supported in said housing, said driving mechanism being operatively connected to said orbiting scroll to effect the orbital motion of said orbiting scroll, rotation preventing means for preventing the rotation of said orbiting scroll during orbital motion whereby the volume of the fluid pockets changes during orbital motion to compress the fluid in the pockets, the improvement comprising:

said housing including a first shell and a separate second shell, said first shell having a first center block disposed therein, said first center block having a peripheral portion extending around the periphery of the compressor and radially beyond said first shell, said first shell being releasably and hermetically secured to a first side of said peripheral portion of said first center block, said second shell including a second center block disposed therein for supporting said driving mechanism, said second shell being releasably and hermetically secured to a second side of said peripheral portion of said first center block.

17. In a scroll type compressor with a hermetically sealed housing, the compressor comprising a fixed scroll fixedly disposed within said housing and having an end plate from which a first wrap extends into the interior of said housing, an orbiting scroll having an end plate from which a second wrap extends, said first and second wraps interfitting at an angular and radial offset to form a plurality of line contacts which define at least one pair of sealed off fluid pockets, a driving mechanism including a motor supported in said housing, said driving mechanism being operatively connected to said orbiting scroll to effect the orbital motion of said orbiting scroll, rotation preventing means for preventing the rotation of said orbiting scroll during orbital motion thereof, whereby the volume of the fluid pockets changes during said orbital motion to compress the fluid in the pockets, the improvement comprising:

said housing including a first casing, a separate second casing and a center block, said first casing housing said fixed scroll, said orbiting scroll and said rotation preventing means, said second casing housing said driving mechanism which further includes a drive shaft;

said center block supporting said driving mechanism and orbiting scroll, said center block including a peripheral portion extending radially beyond said first casing and around the periphery of the housing, said first casing being releasably and hermetically secured to a first side of said peripheral portion and said second casing being releasably and hermetically secured to a second side of said peripheral portion in a manner such that a portion of said center block peripheral portion forms part of the housing outer surface.

18. In a scroll type compressor with a hermetically sealed housing, the compressor comprising a fixed scroll fixedly disposed within said housing and having an end plate from which a first wrap extends into the interior of said housing, an orbiting scroll having an end plate from which a second wrap extends, said first and second wraps interfitting at an angular and radial offset to form a plurality of line contacts which define at least one pair of sealed off fluid pockets, a driving mechanism including a motor supported in said housing, said driving mechanism being operatively connected to said orbiting scroll to effect the orbital motion of said orbiting scroll, rotation preventing means for preventing the rotation of said orbiting scroll during orbital motion thereof, whereby the volume of the fluid pockets changes during said orbital motion to compress the fluid in the pockets, the improvement comprising:

said housing including a first casing and a second casing, said first casing housing said fixed scroll, said orbiting scroll and said rotation preventing means, said second casing housing said driving mechanism which further includes a drive shaft, whereby said first and second casings are releasably secured to a first center block to form said hermetically sealed housing;

said first center block being disposed within said first casing, said first center block having a front surface and a rear surface, said rear surface being connected to a portion of said rotation preventing means;

a second center block being disposed within said second casing and rotatably supporting one end of said drive shaft, said second center block having a front surface facing said first center block front surface; and alignment means formed on engaging portions of said facing surfaces of said first and second center blocks for aligning said drive shaft with said orbiting scroll.

19. The hermetically sealed scroll type compressor of claim 18 wherein said alignment means comprises an annular recess formed at an inner portion of said first center block and an annular projection formed on said second center block.

20. The hermetically sealed scroll type compressor of claim 19 wherein said annular recess includes an abutment surface for preventing said annular projection from penetrating beyond said first center block within said first casing, said abutment surface being substantially normal to the center line of said drive shaft.

21. The hermetically sealed scroll compressor of claim 19 wherein said alignment means further comprises a guide surface formed on said front surface of said first center block for guiding said second center block therealong and toward said annular recess, said guide surface extending radially outwardly from said annular recess.

22. The hermetically sealed scroll compressor of claim 21 wherein said guide surface is frustoconical.

23. The hermetically sealed scroll compressor of claim 22 wherein said front surface of said second center block comprises a frustoconical portion extending radially outwardly from said annular projection.

24. The hermetically sealed scroll compressor of claim 18 wherein said first center block is releasably secured to said first casing.

25. In a scroll type compressor with a hermetically sealed housing, the compressor comprising a fixed scroll fixedly disposed within said housing and having an end plate from which a first wrap extends into the interior of said housing, an orbiting scroll having an end plate from which a second wrap extends, said first and second wraps interfitting at an angular and radial offset to form a plurality of line contacts which define at least one pair of sealed off fluid pockets, a driving mechanism including a motor supported in said housing, said driving mechanism being operatively connected to said orbiting scroll to effect the orbital motion of said orbiting scroll, rotation preventing means for preventing the rotation of said orbiting scroll during orbital motion whereby the volume of the fluid pockets changes during orbital motion to compress the fluid in the pockets, the improvement comprising:

said housing including a first shell, a separate second shell and a center block, said center block comprising a first block and a second separate block, said first block having a peripheral portion extending around the periphery of of the compressor, said peripheral portion including fastening means for releasably and hermetically securing said first shell to a first side of said peripheral portion of said center block and said second shell to a second side of said peripheral portion of said center block, at least a portion of said fastening means securing one of said first and second shells to said peripheral portion of the center block being disposed within the other of said first and second shells, said second block having an interior portion for rotatably supporting a portion of said drive mechanism.

26. The hermetically sealed scroll type compressor of claim 25 wherein said scrolls are surrounded by said first shell and said motor including a rotor and stator is surrounded by the second shell.

27. The hermetically sealed scroll type compressor of claim 26 further comprising said fixed scroll being releasably and hermetically secured to the first shell.

28. The hermetically sealed scroll type compressor of claim 27 wherein each shell is cup shaped.

29. The hermetically sealed scroll type compressor of claim 26 wherein each shell is cup shaped.

30. The hermetically sealed scroll type compressor of claim 25 wherein each shell is cup shaped.

31. The hermetically sealed scroll type compressor of claim 25 wherein at least a portion of said fastening means securing said first shell to said center block is disposed within said second shell and radially inwardly from the inner wall thereof.

* * * * *

UNITED STATES PATENT AND TRADEMARK OFFICE
CERTIFICATE OF CORRECTION

PATENT NO. : 4,900,238

DATED : February 13, 1990

INVENTOR(S) : Shigemi Shimizu et al.

It is certified that error appears in the above-identified patent and that said Letters Patent is hereby corrected as shown below: Title page:

Face of Patent, Section [19], delete "Shigemi" and insert —Shimizu—;

Face of Patent, Section [75], Inventors:, delete in its entirety and insert —Shigemi Shimizu, Sakai; Kazuto Kikuchi, Honjo; Kiyoshi Terauchi, Isesaki, all of Japan—;

Column 1, line 41, after "improve" insert —an—;

Column 4, line 31, delete "constructions" and insert —construction—;

Column 6, Claim 3, line 3 of claim, delete "sealed" and insert —secured—;

Column 7, Claim 15, line 2 of claim, delete "and" (first occurrence);

Column 9, Claim 18, line 23 of claim, delete "whereby" and insert —wherein— and

Column 10, Claim 25, line 22 of claim, delete "of" (first occurrence).

Signed and Sealed this

Twentieth Day of August, 1991

Attest:

HARRY F. MANBECK, JR.

Attesting Officer

Commissioner of Patents and Trademarks